United States Patent [19]

Kakihana

[11] Patent Number: 4,864,372
[45] Date of Patent: Sep. 5, 1989

[54] FIELD EFFECT TRANSISTOR

[75] Inventor: Sanehiko Kakihana, Palo Alto, Calif.

[73] Assignee: Litton Systems, Inc., Beverly Hills, Calif.

[21] Appl. No.: 835,707

[22] Filed: Mar. 3, 1986

Related U.S. Application Data

[63] Continuation of Ser. No. 543,479, Oct. 19, 1983, abandoned.

[51] Int. Cl.$^4$ .............................................. H01L 29/80
[52] U.S. Cl. ...................................... 357/22; 357/15; 357/90
[58] Field of Search .................... 357/22 I, 22 S, 23.2, 357/23.3, 23.1, 15, 90

[56] References Cited

U.S. PATENT DOCUMENTS

H368 11/1987 Yoder .................................. 357/22 I
4,425,573 1/1984 Ristow .................................. 357/91

Primary Examiner—Andrew J. James
Assistant Examiner—Mark Prenty
Attorney, Agent, or Firm—Gerald L. Cline

[57] ABSTRACT

This disclosure depicts a novel semiconductor device and the method of making it. A novel field effect transistor (FET) has a channel region which is heavily doped under the gate and between the gate and the source of the FET. The channel region between the gate and the drain is lightly doped. The FET is formed on a heavily doped semiconductor substrate. The method of making the novel FET comprises providing a mask layer over a lightly doped channel region and forming openings in the mask layer such that a portion of the mask is located at the gate location and has a predetermined width and height.

4 Claims, 3 Drawing Sheets

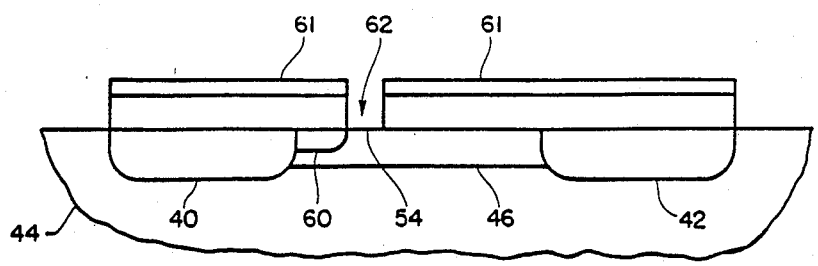
_Fig. 5_
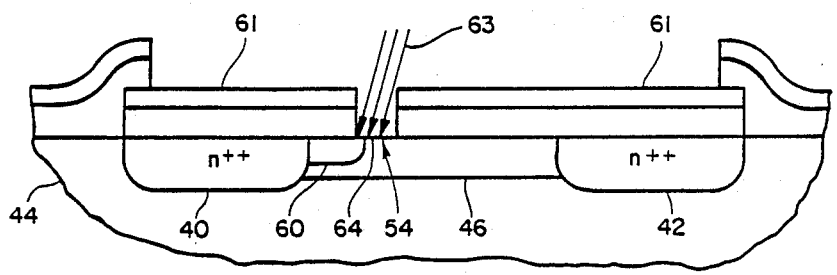
_Fig. 6_
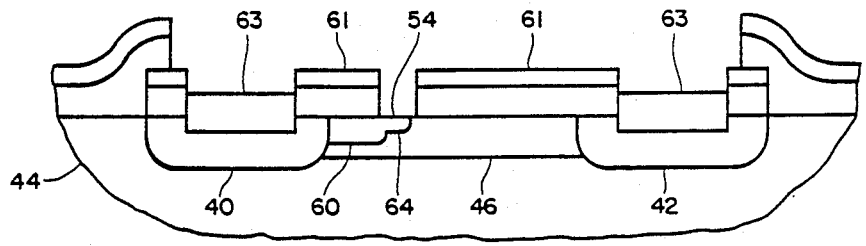
_Fig. 7_
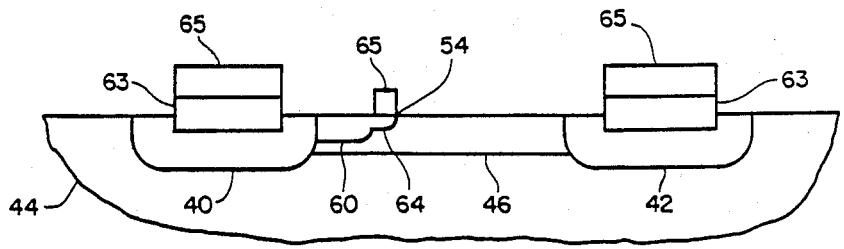
_Fig. 8_

FIELD EFFECT TRANSISTOR

This application is a continuation, of application Ser. No. 543,479, filed 10/19/83 and now abandoned.

BACKGROUND OF THE INVENTION

This invention relates generally to semiconductor devices and in particular to field effect transistors having a conducting channel which is more heavily doped between a gate and a source region than between the gate and a drain region of the field effect transistor and a method for making the novel field effect transistor.

Presently gallium arsenide field effect transistors have a uniform, active conducting channel between the drain and source regions. For many applications it is desirable to have field effect transistors which have the characteristics of high output breakdown voltage with high output power and high gain for given frequency such as 18 gigahertz. It is known in the art that to achieve high power output in bipolar transistors a lightly doped i-layer is constructed between the base region and collector region of the transistor. This causes the collector to base capacitance to be low and thus leads to considerably higher cut-off frequencies. Furthermore, the lightly doped layer between the gate and drain results in high gate to drain as well as source to drain voltage breakdown which lead to higher power capability. Because the field effect transistor has a different structure than the bipolar transistor, an economical method of manufacturing a field effect transistor utilizing the i-layer does not exist in the prior art. The present invention provides a solution to this problem in the prior art and provides a novel field effect transistor and a method of making it.

SUMMARY OF THE INVENTION

The present invention involves a novel semiconductor device and the method of making it. A novel field effect transistor (FET) has a channel region which is heavily doped between the gate and the source and lightly doped between the gate and the drain of the FET. The method of making the novel FET comprises providing a masking layer over a lightly doped channel region and forming openings in the masking layer such that a portion of the mask is located at the gate location and has a predetermined width and height. Ion implanting is performed at a predetermined angle such that a first portion of the channel region adjacent the source region is heavily doped and a second portion of the channel region adjacent the drain region is not exposed due to the height of the masked portion.

OBJECTS OF THE INVENTION

It is a secondary object of the present invention to provide a method of fabricating a field effect transistor having a high output breakdown voltage, and high power output and high gain for a given frequency.

It is a primary object of the present invention to provide a novel field effect transistor which has a channel region which is heavily doped immediately under the gate to maximize transconductance and also is heavily doped between the gate and source to minimize the source resistance and lightly doped between the gate and drain of the field effect transistor.

BRIEF DESCRIPTION OF THE DRAWINGS

The features of the present invention which are believed to be novel are set forth with particularity in the appended claims. The invention together with further objects and advantages may best be understood by reference to the following description taken in conjunction with the accompanying drawings, in the several figures of which like reference numerals identify like elements, and in which:

FIGS. 3 through 8 illustrate in cross sectional view the novel method of making the field effect transistor.

DESCRIPTION OF THE PREFERRED EMBODIMENT

Figure 1:
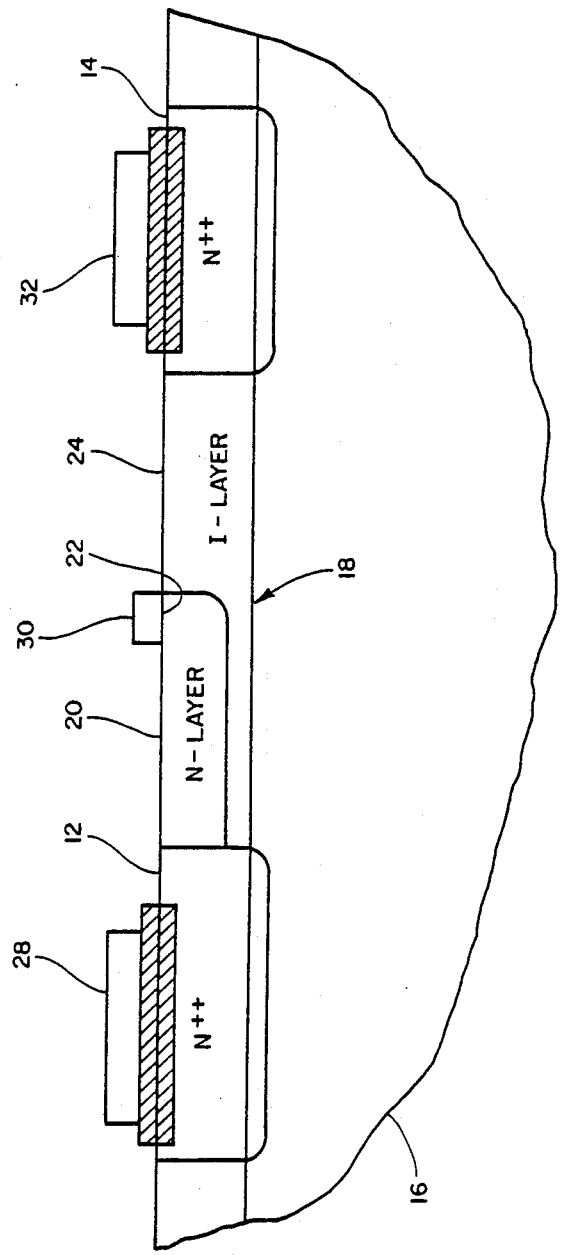
FIG. 1 is a cross sectional view of the novel field effect transistor.

This invention pertains to a novel field effect transistor and method of making it. FIG. 1 of the drawings illustrates in cross sectional view the structure of the novel FET. The FET has an N++ source region 12 and an N++ drain region 14 implanted in an N-type semi-insulating substrate 16. A conducting channel 18 bridges the area between the source region 12 and the drain region 14. An N layer comprises a first portion 20 of the channel 18 and is located between the source region 12 and a gate location 22. A second portion of the conductor 18 is a lightly doped N layer and is located between the gate location 22 and the drain region 14. This lightly doped portion 24 is referred to as the i-layer. Electrical contacts 28, 30 and 32 are provided, respectively, for the source region 12, the gate location and the drain region 14. In the preferred embodiment the i-layer 24 extends under the heavily doped layer 20 of the channel 18 to the source region 12 to provide for pinch-off.

Figure 2:
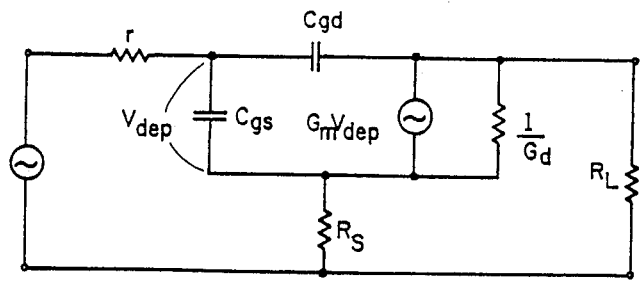
FIG. 2 is an equivalent circuit of the FIG. 1 field effect transistor.
Figure 3:
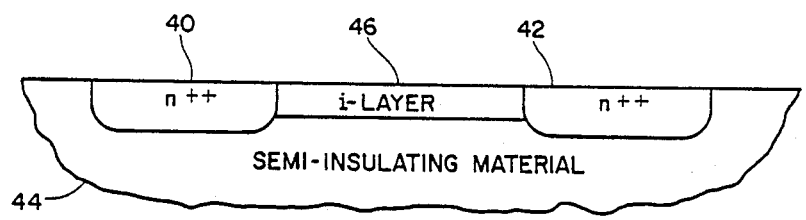
Figure 4:
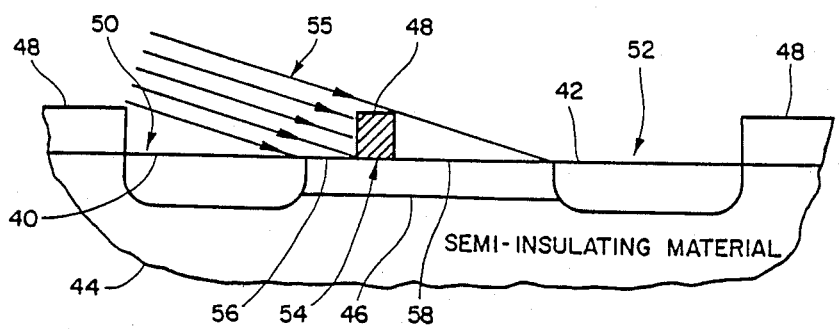

The effect of the i-layer 24 between the gate 22 and the drain region 14 is best explained by reference to the equivalent circuit shown in FIG. 2. The power gain based on the equivalent circuit of FIG. 2 is given by the following expression.

$$(P.G.) = \frac{G_m^2}{G_d + G_L}(1 - \Omega^2 C_{gs}^2 R_i^2)\frac{G_L X_{gs}^2}{r} \quad \text{Eqn (1)}$$

Where
$G_m$: Transconductance
$G_d$: Drain to source dynamic conductance (inverse of dynamic drain-to-source resistance)
$G_L$: Load conductance (inverse of load resistance)
$C_{gs}$: Gate-to-source capacitance including parasitic capacitance
$R_i$: Sum of source contact resistance and extrinsic resistance between source and gate
$X_{gs} = 1/C_{gs}$: Gate-to-source reactance
$V_{dep}$: Voltage impressed across the gate depletion region
$r$: Factor defined by equality $$\frac{E^2}{4Z_o} = \frac{r}{2}\left(\frac{V_{dep}}{X_{gs}}\right)^2$$

From equation 1 it can be seen that in order to get high power at high frequencies the input time constant, $C_{gs} R_i$, must be made small. Since $R_i$ includes both source contact resistance and extrinsic resistance between the source and drain, both these resistances must be kept low. The doping of portion 20 of the channel 18 between the source region 12 and the gate location 22 must be kept high to keep the extrinsic resistance low. Further, the drain to source resistance must be made high (low $G_d$) in order to achieve both high gain and high power output. Also, the transconductance ($G_m$) must be kept high for high gain and power output. The transconductance is proportional to the gate channel doping.

In the conventional gallium arsenide field effect transistor the doping between the source and drain is uniform. (In some cases the doping profile in the vertical direction is made to vary to achieve higher transconductance near pinch-off to achieve better noise figure.) As the transconductance, $G_m$, is made higher and the source contact resistance and extrinsic resistance between source and gate, $R_i$, is made lower by doping the channel, the drain to source dynamic conductance, $G_d$, will also increase. According to equation 1 this results in a decrease in the power gain. Furthermore, the power output capability will be lower because both drain to gate and drain to source voltage breakdown will be lower.

In the novel FET of the present invention the doping in portion 20 of the channel 18 is heavier than the doping in portion 24 of the channel 18. This results in a gate to source capacitance which is not excessive and provides the gate to source breakdown voltage which is high enough for operation. Lightly doping the gate to drain region of the channel 18 achieves high breakdown voltage for high power output with lower $G_d$ for higher gain, and lower $C_{gd}$ also for higher gain. This provides the capability to operate at a higher drain to source voltage for a given power output with a lower bias current. This is a very important feature in many applications such as phased array radar where a large $I^2R$ loss in the distributing copper wire becomes significant.

In the FIG. 1 preferred embodiment the average concentrations from ion implantation are about $10^{18}$ atoms/cm$^3$ for the source region 12 and drain region 14, $5 \times 10^{16}$ atoms/cm$^3$ for the i-layer or portion 24 of the channel 18 and $10^{17}$ atoms/cm$^3$ for portion 20 of the channel 18. In the case of the channel 18 the layer depth of portion 24 is approximately 1.0 micron and the layer depth of portion 20 is approximately 0.6 micron.

In general the method for making the novel semiconductor device which has at least one region of semiconductor material comprises first, forming a mask at least over the semiconductor material. The mask has at least one mask portion of predetermined height with openings in the mask on either side of the mask portion. And, secondly ion implanting the semiconductor material at a predetermined angle such that a first portion of the semiconductor material is exposed and a second portion of the semiconductor material is not exposed because of the mask portion of predetermined height.

In respect to the field effect transistor shown in FIG. 1 the method in general comprises: providing a substrate of semi-insulating material; forming a heavily doped drain region and a heavily doped source region spaced a predetermined distance apart on the substrate; forming a lightly doped channel region on the substrate between the drain region and the source region; forming a first masking layer having a photoresist line of predetermined height over the substrate and the drain, source and channel regions; forming openings in the first masking layer at least over the channel region except for a gate location having a predetermined width and located intermediate the drain to source regions; ion implanting at a predetermined angle such that a first portion of the channel region adjacent the source region is heavily doped and a second portion of the channel region adjacent the drain region is not exposed due to the height of the masked layer at the gate location; removing the first masked layer; and forming electrical contacts on the source and drain regions.

FIGS. 3 through 8 illustrate the method described in general above. Using standard photoresist masking techniques and ion implantation, source and drain regions 40 and 42 are formed in a semi-insulating material 44. A lightly doped channel region 46 bridges the predetermined distance between the drain and source regions 40 and 42. As part of the claimed invention, a first mask layer 48 is formed over the substrate 44 and source, drain and channel regions 40, 42 and 46. Openings 50 and 52 are formed in the first masking layer 48 at least over the channel region 46 except for a gate location 54 having a predetermined width and located intermediate the drain and source regions 42 and 40. In the preferred embodiment the height of the first masking layer is 1.0 micron. (See FIG. 4.) Ion beam 55 is directed at a predetermined angle such that a first portion 56 of the channel region 46 adjacent the source region 40 is heavily doped and a second portion 58 of the channel region 46 is not exposed due to the height of the masked layer 48 at the gate location 54.

As shown in FIG. 5 a heavily doped fourth region 60 is formed in the channel 46. A second mask 61 of silicon dioxide ($SiO_2$) and silicon nitrate ($Si_3N_4$) is formed using standard techniques as shown in FIG. 5. The first mask 48 is removed leaving an opening 62 at the gate location 54. As shown in FIG. 6 ion implantation 63 is conducted at a second predetermined angle such that the portion 64 under the gate location 54 is substantially heavily doped, effectively extending the first portion 60. The resulting first portion 60 and 64 is shown in FIG. 7. Also shown in FIG. 7 is the deposition of ohmic contact metal 63 of any suitable type over the source and drain regions 40 and 42. In the preferred embodiment gold germanium nickel is utilized as the ohmic contact metal. The second mask 61 is then removed after appropriate electrical contact material 65 such as titanium tungsten/gold is formed by evaporating the metal at a predetermined angle to cover a portion of the opening 54 closer to the source. The same metal layers will be deposited over the drain and source regions 40 and 42 to provide electrical contacts. The resulting structure is illustrated in FIG. 8.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:
1. A field effect transistor comprising:
   a. a semi-insulating substrate of semiconductor;
   b. a heavily doped drain region of semiconductor spaced a predetermined distance from a heavily doped source region of semiconductor on said substrate;

c. a heavily doped channel region of semiconductor extending a predetermined distance from said source region to a gate location located intermediate said source and drain regions, said heavily doped channel region also extending under said gate location and in direction contact with a gate terminal at said gate location; and d. a lightly doped channel region of semiconductor located between said gate location and said drain region and extending also under said heavily doped channel region.

2. The field effect transistor of claim 1 wherein said semiconductor comprises gallium arsenide.

3. The field effect transistor of claim 1 wherein said heavily doped channel region has a thickness of approximately 0.6 micron and said lightly doped channel region has a thickness of approximately one micron.

4. The field effect transistor of claim 1 wherein said lightly doped channel region has a predetermined thickness and said heavily doped channel region has a predetermined thickness less than said thickness of said lightly doped channel region.

* * * * *